United States Patent

Sato

[11] Patent Number: 5,869,898
[45] Date of Patent: Feb. 9, 1999

[54] LEAD-FRAME HAVING INTERDIGITATED SIGNAL AND GROUND LEADS WITH HIGH FREQUENCY LEADS POSITIONED ADJACENT A CORNER AND SHIELDED BY GROUND LEADS ON EITHER SIDE THEREOF

[75] Inventor: Kazunari Sato, Tokyo, Japan

[73] Assignee: NEC Corporation, Tokyo, Japan

[21] Appl. No.: 847,500

[22] Filed: Apr. 25, 1997

[51] Int. Cl.[6] .......................... H01L 23/495; H01L 27/02; H01L 23/48
[52] U.S. Cl. .......................... 257/728; 257/692; 257/696; 257/698; 257/666; 257/691
[58] Field of Search .................... 257/666, 676, 257/668, 692, 672, 787, 712, 673, 691, 717, 720, 475, 728, 698, 696; 174/52.4; 29/827; 361/813

[56] References Cited

U.S. PATENT DOCUMENTS

| | | | |
|---|---|---|---|
| 4,506,285 | 3/1985 | Einzinger | 257/724 |
| 5,223,740 | 6/1993 | Ishikawa et al. | 257/676 |
| 5,229,846 | 7/1993 | Kozuka | 257/678 |
| 5,276,352 | 1/1994 | Komenaka et al. | 257/666 |
| 5,393,705 | 2/1995 | Sonobe | 1/1 |
| 5,594,234 | 1/1997 | Carter, Jr. et al. | 257/666 |
| 5,648,682 | 7/1997 | Nakazawa et al. | 257/673 |

FOREIGN PATENT DOCUMENTS 63-202948  8/1988  Japan .
64-84626   3/1989  Japan .

*Primary Examiner*—Tom Thomas
*Assistant Examiner*—Alexander Oscar Williams
*Attorney, Agent, or Firm*—Foley & Lardner

[57] ABSTRACT

A lead-frame is sealed in a full-mold insulating package together with a semiconductor chip; the lead-frame has a conductive die pad for mounting the semiconductor chip, first conductive leads integral with the conductive die pad and electrically connected through conductive wires to bonding pads of the semiconductor chip so as to supply a ground potential to the semiconductor chip and second conductive leads separated from the conductive die pad so as to supply high-frequency input signals through conductive wires to other bonding pads, and the second conductive leads are respectively located between the first conductive leads and other first conductive leads closest to the corners of the full-mold package so that a good electrical isolation is provided between the second conductive leads.

6 Claims, 4 Drawing Sheets

LEAD-FRAME HAVING INTERDIGITATED SIGNAL AND GROUND LEADS WITH HIGH FREQUENCY LEADS POSITIONED ADJACENT A CORNER AND SHIELDED BY GROUND LEADS ON EITHER SIDE THEREOF

FIELD OF THE INVENTION

This invention relates to a lead-frame available for mounting a semiconductor chip and, more particularly, to a lead-frame incorporated in a semiconductor integrated circuit device for processing a micro-wave signal.

DESCRIPTION OF THE RELATED ART

Typical examples of the lead-frame are disclosed in Japanese Patent Publication of Unexamined Application Nos. 64-84626 and 63-202948. In the following description, the lead-frame disclosed in Japanese Patent Publication of Unexamined Application No. 64-84626 and the lead-frame disclosed in Japanese Patent Publication of Unexamined Application No. 63-202948 are referred to as "first prior art" and "second prior art", respectively.

FIGS. 1 and 2 illustrate the first prior art, and the first prior art largely comprises a carrier 1, a semiconductor chip 2 and bumps 3 between the carrier 1 and the semiconductor chip 2 for electrical connections.

The carrier 1 includes a flexible film 1a of polyimide, inner conductive leads 1b patterned on the upper surface of the flexible film 1a together with a shared conductive pattern 1c, conductive pads 1d patterned on the lower surface of the flexible film 1a and conductive plugs 1e in contact holes 1f formed in the flexible film 1a. The inner conductive leads 1b are held in contact with the upper surfaces of the conductive plugs 1e, respectively, and the conductive pads 1d are held in contact with the lower surfaces of the conductive plugs 1e, respectively. Thus, the inner conductive leads 1b are electrically connected through the conductive plugs 1e to the conductive pads 1d, respectively.

The inner conductive leads 1b provide high-speed signal propagation paths to electric signals, and the shared conductive pattern 1c is grounded. The shared conductive pattern 1c is branched into finger portions 1g, and the finger portions 1g form a plurality of slits 1h on the upper surface of the flexible film 1a. The inner conductive leads 1b are respectively located in the slits 1h, and are interdigitated with the finger portions 1g. The inner conductive leads 1b are designed to have a characteristic impedance, and the finger portions 1g electrically isolate the inner conductive leads from one another.

The semiconductor chip 2 has a plurality of conductive bonding pads 2a, and the conductive pads 1d are directly bonded through the bumps 3 to the conductive bonding pads 2a without a bonding wire.

FIG. 3 illustrates the second prior art. The prior art lead-frame 5 includes a die pad 5a for mounting a semiconductor chip 6, conductive leads 5b assigned to a ground potential, other conductive leads 5c assigned to high-frequency electric signals, and projections 5d arranged on the die pad 5a around the semiconductor chip 6. The conductive leads 5b and the projections 5d are integral with the die pad 5a, and the other conductive leads 5c are separated from the die pad 5a. The semiconductor chip 6 is soldered or adhered to the die pad 5a, and has bonding pads (not shown) connected through conductive wires 7 to the conductive leads 5c assigned to the high-frequency electric signals and the projections 5d.

High-speed transistors formed of compound semiconductor such as GaAs are incorporated in the semiconductor chip 6, and the source potential is supplied through the conductive leads 5b, the die pad 5a, the projections 5d and the conductive wires 7 to the source nodes of the high-speed transistors. Thus, the high-speed transistors are powered with a power voltage and the ground voltage, and are responsive to the high-frequency electric signals so as to achieve a given task.

The conductive leads 5b are integral with the die pad 5a, and a conductive wire is required for the electrical connection between the conductive leads 5b and the die pad 5a. For this reason, the ground line in the semiconductor chip is prevented from undesirable potential rise, and the parasitic inductance is reduced.

The lead-frame 1 of the first prior art is connected through the bumps 3 to the bonding pads 2a of the semiconductor chip 2, and a manufacturer is required to precisely align the conductive pads 1d, the bumps 3 and the bonding pads 2a with one another. However, it is difficult to achieve the precise alignment between all the conductive pads 1d, all the bumps 3 and all the bonding pads 2a, and, for this reason, the yield in the assembling work is not so high.

The lead-frame 5 of the second prior art achieves a high yield in the assembling work, because the conductive leads 5c are individually connected through the conductive wires 7 to the bonding pads (not shown). However, when the lead-frame 5 is molded in a plastic package, a large amount of parasitic capacitance is coupled to each of the conductive leads 5b/5c, and the high-speed transistors hardly respond to the high-frequency electric signal over 10 GHz.

SUMMARY OF THE INVENTION

It is therefore an important object of the present invention to provide a lead-frame which allows an electric component of a semiconductor chip mounted thereon to respond to a high-frequency signal over 10 GHz without sacrifice of the yield in the assembling work between the lead-frame and the semiconductor chip.

To accomplish the object, the present invention proposes to locate a conductive lead assigned to a high-frequency signal between other conductive leads assigned to a constant voltage such as the ground voltage.

In accordance with the present invention, there is provided a lead-frame sealed in an insulating package together with a semiconductor chip, comprising: a conductive die pad fixed to a bottom surface of the semiconductor chip; a plurality of first conductive leads integral with the conductive die pad, assigned to a constant voltage, and selectively projecting from a first side of the insulating package and a second side of the insulating package opposite to the first side; at least two second conductive leads separated from the conductive die pad, projecting from the first side and the second side, respectively, located between two pairs of the plurality of first conductive leads, respectively, and assigned to first electric signals, respectively; and a plurality of conductive wires connecting the plurality of first conductive leads and the at least two second conductive leads to a plurality of bonding pads formed on a top surface of the semiconductor chip.

BRIEF DESCRIPTION OF THE DRAWINGS

The features and advantages of the lead-frame according to the present invention will be more clearly understood from the following description taken in conjunction with the accompanying drawings in which.

DESCRIPTION OF THE PREFERRED EMBODIMENT

Figure 1:
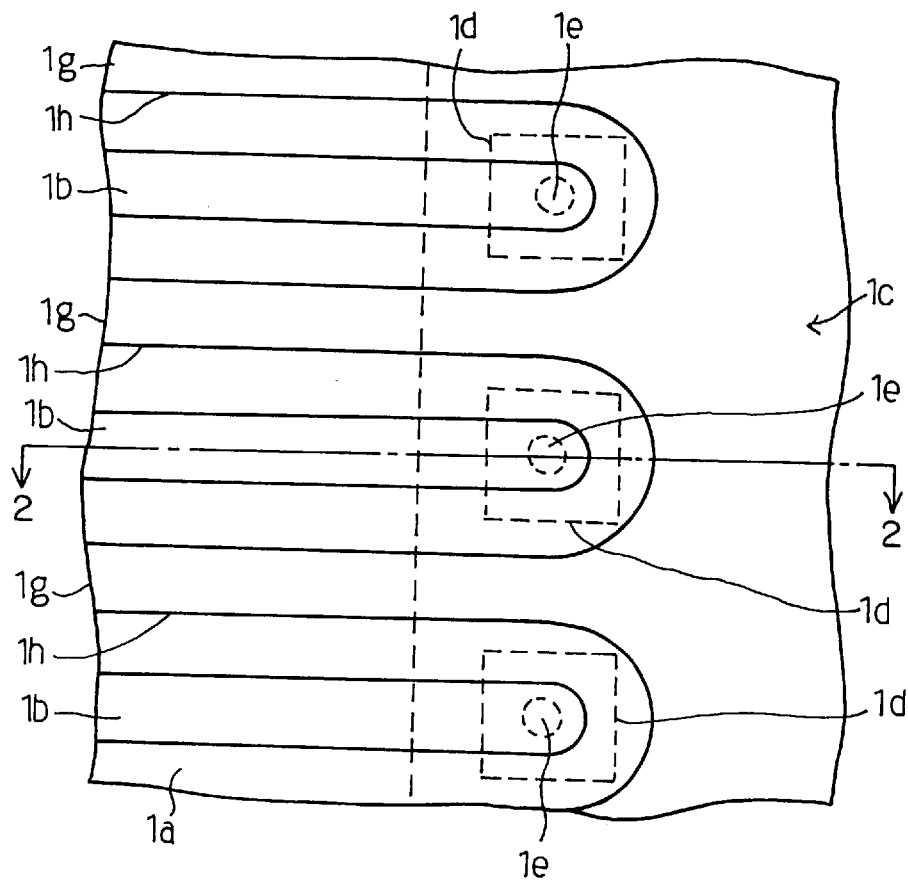
FIG. 1 is a plan view showing the inner leads of the first prior art patterned on the film carrier and bonded through bumps to the bonding pads of the semiconductor chip.
Figure 2:
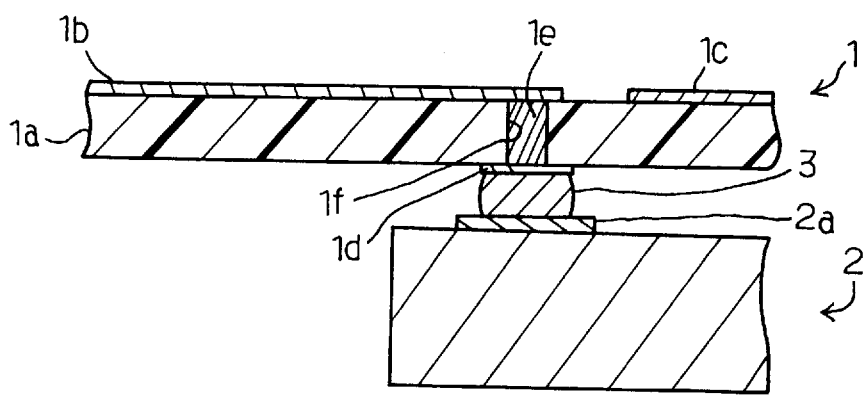
FIG. 2 is a cross sectional view taken along line, 2—2 of FIG. 1 and showing the structure of the first prior art.
Figure 3:
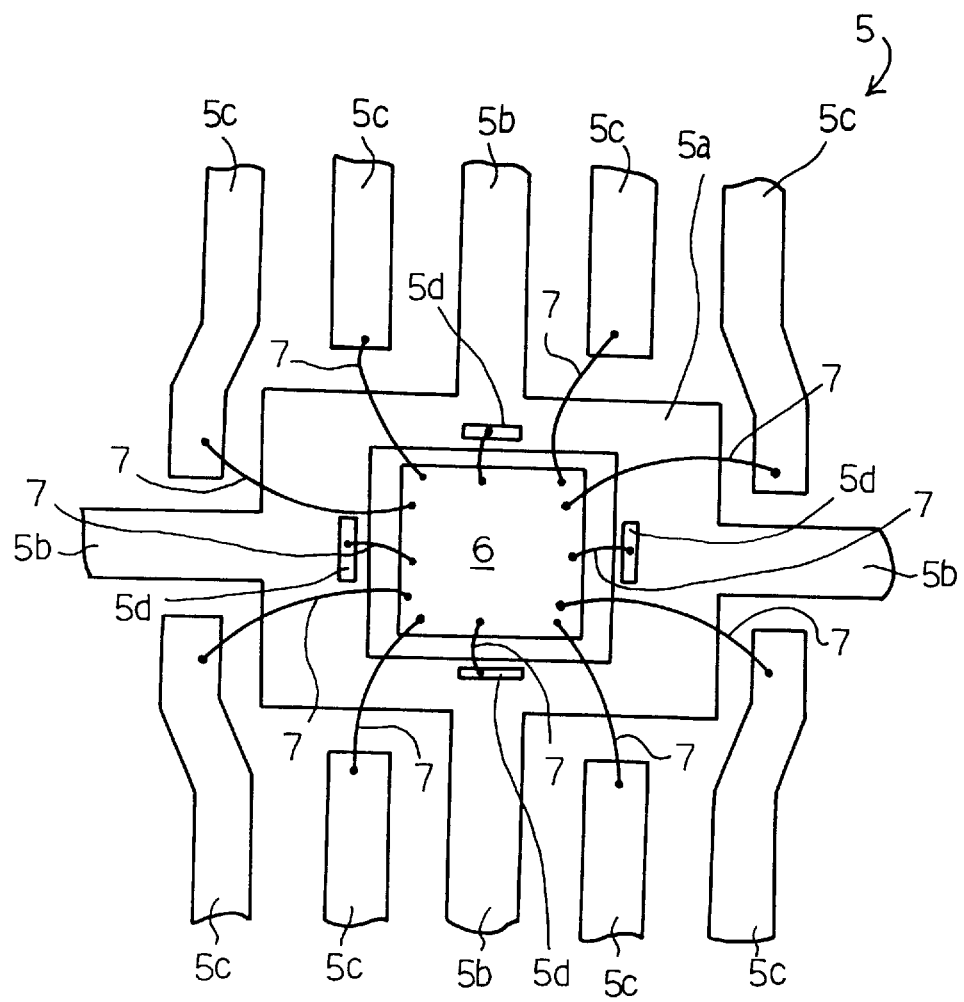
FIG. 3 is a plan view showing the arrangement of the second prior art.
Figure 4:
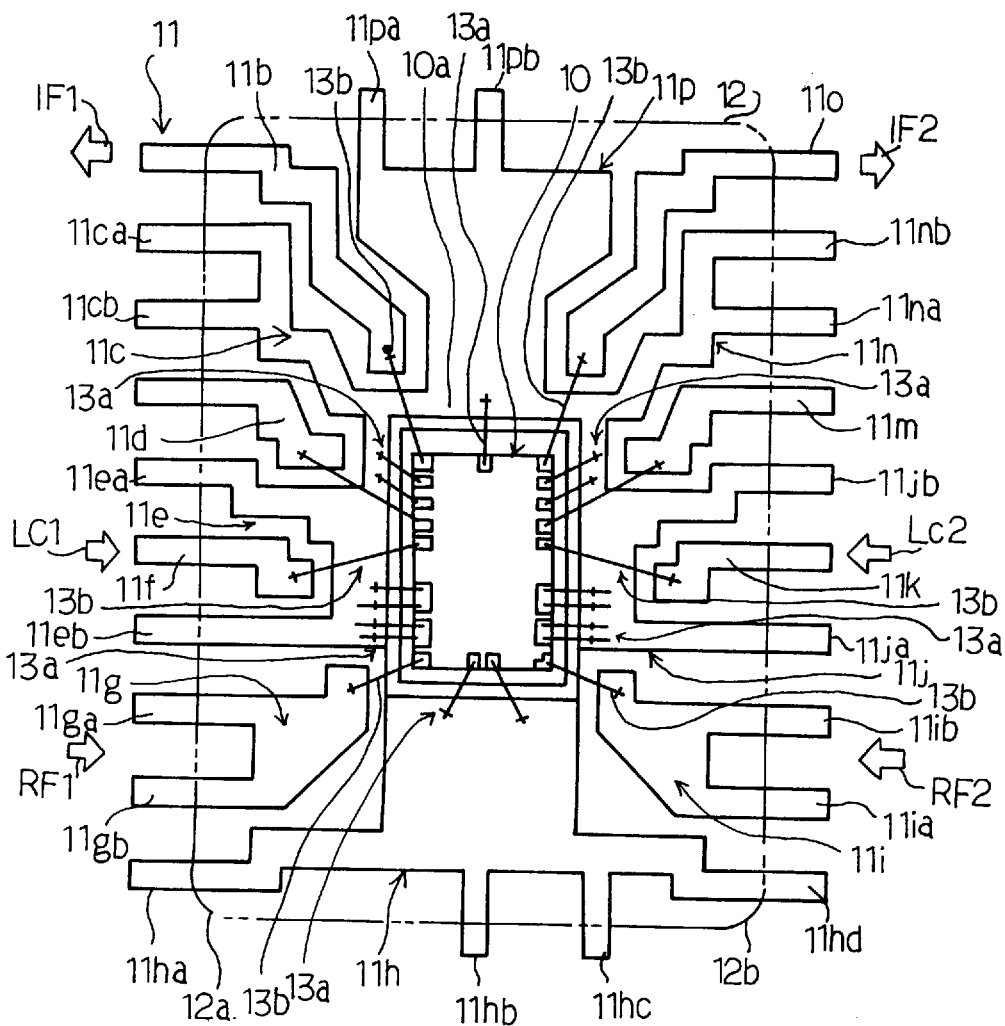
FIG. 4 is a plan view showing a lead-frame incorporated in a semiconductor device according to the present invention.

Referring to FIG. 4 of the drawings, a semiconductor chip 10 is assembled with a lead-frame 11 embodying the present invention, and is sealed in a full-mold package 12 formed of insulating material such as, for example, epoxy resin. High-speed transistors are incorporated in the semiconductor chip 10, and form parts of two-input two-output MMIC (Monolithic Microwave Integrated Circuit) for DBS (Direct Broadcasting Satellite) use. The lead-frame 11 includes a die pad 10a formed of conductive material and conductive leads 11b, 11c, 11d, 11e, 11f, 11g, 11h, 11i, 11j, 11k, 11m, 11n, 11o and 11p. The conductive leads 11c, 11e, 11j, 11n and 11p are integral with the die pad 10a, and are bifurcated into pairs of ground pins 11ca/11cb, 11ea/11eb, 11ja/11jb, 11na/11nb and 11pa/11pb. The conductive lead 11h is also integral with the die pad 11a, and is branched into four ground pins. The conductive leads 11b, 11d, 11f, 11k, 11m and 11o are separated from the die pad 10a, and project from the full mold package 12 as standard signal pins. The other conductive leads 11g and 11i are separated from the die pad 10a, and are bifurcated into pairs of high-frequency signal pins 11ga/11gb and 11ia/11ib.

The standard signal pins 11b/11d/11f, the pairs of ground pins 11ca/11cb and 11ea/11eb, the pair of high-frequency signal pins 11ga/11gb and one of the four ground pins 11ha are arranged along one side of the full-mold package 12, and another of the four ground pins 11hd, the standard signal pins 11k/11m/11o, the pairs of ground pins 11ja/11jb and 11na/11nb and the pair of high-frequency signal pins 11ia/11ib are arranged along the other side of the full-mold package 12. The pair of ground pins 11pa/11pb projects from one edge of the full-mold package 12, and the remaining ground pins 11hb/11hc project from the other edge of the full-mold package 12.

The pair of high-frequency signal pins 11ga/11gb is located between the ground pin 11ha close to the corner 12a and the ground pin 11eb. Similarly, the pair of high-frequency signal pins 11ia/11ib are located between the ground pin close to the corner 12b and the ground pin 11ja. For this reason, a good electrical isolation is provided for the pairs of high-frequency signal pins 11ga/11gb and 11ia/11ib.

The semiconductor chip 10 is fixed to the die pad 10a by means of a suitable substance such as, for example, solder or adhesive compound. A plurality of bonding pads, which are represented by small boxes in FIG. 4, are formed on the upper surface of the semiconductor chip 10, and are selectively connected through conductive wires 13a/13b to the conductive leads 11b to 11p. The conductive wires 13a between the conductive leads 11c/11e/11h/ 11j/11n/11p and the bonding pads are relatively short, and, for this reason, only a small amount of parasitic capacitance is coupled to a ground line (not shown) in the semiconductor chip 10. On the other hand, relatively long conductive wires 13b are respectively connected between the conductive leads 11b/11d/11f/11g/11i/11k/11m/11o and the bonding pads assigned to input/output signals.

In this instance, the pairs of high-frequency signal pins 11ga/11gb and 11ia/11ib are respectively assigned to a first radio-frequency input signal RF1 and a second radio-frequency input signal RF2, and the standard signal pins 11f/11k are respectively assigned to a first local input signal LC1 and a second local input signal LC2. The first and second radio-frequency input signals RF1/RF2 carry pieces of data information on a suitable frequency between 10 GHz to 13 GHz, and, for this reason, the conductive leads 11g/11i are required to have the electrical isolation at −20 dB or less. The ground pins 11eb/11ha and 11hd/11ja achieve the electrical isolation less than −20 dB for the conductive leads 11g/11i.

The standard signal pins 11b and 11o are respectively assigned to a first intermediate-frequency output signal IF1 and a second intermediate-frequency output signal IF2. The first and second intermediate frequency output signals IF1/IF2 carry pieces of data information on a suitable frequency between 0.9 GHz and 2.2 GHz. For this reason, even if the ground pin 11pa merely extends along a part of the standard signal pin 11b, a good electrical isolation equal to or less than −20 dB is provided for the standard signal pin 11b through a known technique.

Figure 5A:
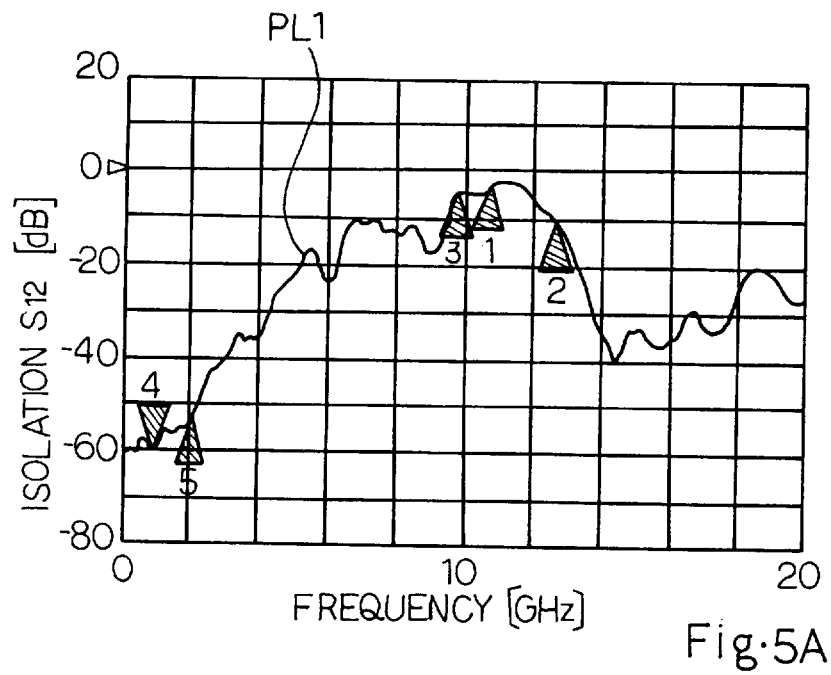
FIGS. 5A and 5B are graphs showing the electrical isolation for conductive leads in terms of signal frequency.
Figure 5B:
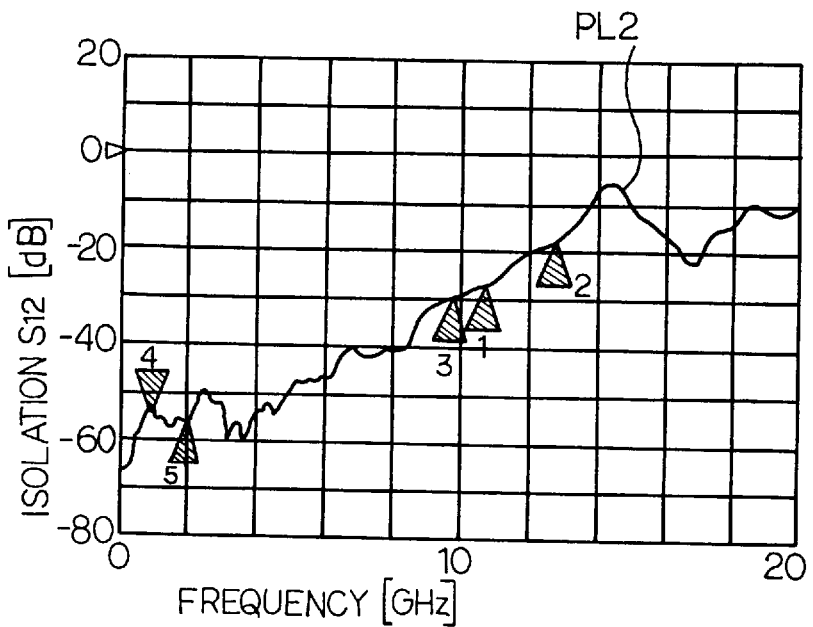

The present inventor evaluated the semiconductor device shown in FIG. 4. The present inventor changed the frequency of a test signal applied to pins subjected to the evaluation, and measured an electrical isolation S12 in terms of the signal frequency. The electrical isolation S12 was plotted in FIGS. 5A and 5B. Plots PL1 were indicative of the electrical isolation S12 between the standard signal pins 11b and 11o, and plots PL2 represented the electrical isolation S12 between the pair of high-frequency signal pins 11ga/11gb and the pair of high-frequency signal pins 11ia/11ib. In FIGS. 5A and 5B, reference markers "1", "2", "3", "4" and "5" indicate typical frequencies used in the DBS integrated circuits, and are 10.7 GHz, 12.75 GHz, 9.75 GHZ, 0.95 GHz and 2.15 GHz.

As will be understood from plots PL1, the electrical isolation S12 between the standard signal pins 11b and 11o reached −20 dB at 5 GHz; however, the electrical isolation is acceptable for the intermediate frequency signals IF1/IF2. Moreover, plots PL2 taught the present inventor that the electrical isolation S12 between the pairs of high-frequency signal pins 11ga/11gb and 11ia/11ib was maintained less than −20 dB until the signal frequency of 13 GHz. For this reason, the present inventor concluded that the lead-frame 11 was available for the full-mold package.

Thus, the lead-frame 11 according to the present invention achieves a good electrical isolation for the conductive leads 11g/11i assigned to the high-frequency input signals in the radio-frequency band.

The conductive leads 11b to 11p are individually connected through the conductive wires 13a/13b to the bonding pads on the semiconductor chip 10, and, for this reason, the semiconductor device according to the present invention is free from the mis-alignment inherent in the first prior art. This results in improvement of the yield in the assembling work.

Although a particular embodiment of the present invention has been shown and described, it will be obvious to those skilled in the art that various changes and modifications may be made without departing from the spirit and scope of the present invention.

What is claimed is:

1. A lead-frame sealed in an insulating package together with a semiconductor chip, comprising:

a conductive die pad fixed to a bottom surface of said semiconductor chip;

a plurality of first conductive leads integral with said conductive die pad, assigned to a constant voltage, and projecting from a first side of said insulating package and a second side of said insulating package opposite to said first side;

at least two second conductive leads separated from said conductive die pad and projecting from said first side of said insulating package;

at least two third conductive leads separated from said conductive die pad and projecting from said second side of said insulating package;

said second conductive leads interdigitated between at least two of said plurality of first conductive leads;

said third conductive leads interdigitated between at least a different two of said plurality of first conductive leads;

a first high frequency lead, adapted to carry high frequency signals, said first high frequency lead separate from said conductive die pad and positioned on said first side of said insulating package adjacent a first corner of said insulating package;

a second high frequency lead, adapted to carry high frequency signals, said second high frequency lead separate from said conductive die pad and positioned on said second side of said insulating package adjacent a second corner of said insulating package;

said first and second high frequency leads electrically shielded against RF radiation by pairs of said first conductive leads positioned on either side thereof, one lead of each of said shielding pairs of first conductive leads being electrically connected together; and a plurality of conductive wires connecting said plurality of first conductive leads, said at least two second and third conductive leads and said first and second high frequency leads to a plurality of bonding pads formed on a top surface of said semiconductor chip.

2. The lead-frame as set forth in claim 1 wherein said high frequency signals are equal to or greater than 10 GHz.

3. The lead-frame as set forth in claim 2, wherein at least one of said second conductive and at least one of said third leads are adapted to receive electrical signals having a frequency lower than that of said high frequency signals.

4. The lead-frame as set forth in claim 1, wherein said first and second high frequency leads are bifurcated into pairs of high-frequency signal pins projecting from said first side and said second side, respectively.

5. The lead-frame as set forth in claim 4, wherein one lead of said shielding pairs of first conductive leads which are electrically connected together projects from a first corner of said insulating package and the other lead of said shielding pairs of first conductive leads which are electrically connected together projects from said second corner of said insulating package.

6. The lead-frame as set forth in claim 1, in which said constant voltage is a ground voltage.

* * * * *